(12) United States Patent
Hajati

(10) Patent No.: US 8,767,512 B2
(45) Date of Patent: Jul. 1, 2014

(54) MULTI-FREQUENCY ULTRA WIDE BANDWIDTH TRANSDUCER

(71) Applicant: Arman Hajati, Santa Clara, CA (US)

(72) Inventor: Arman Hajati, Santa Clara, CA (US)

(73) Assignee: Fujifilm Dimatix, Inc., Lebanon, NH (US)

( * ) Notice: Subject to any disclaimer, the term of this patent is extended or adjusted under 35 U.S.C. 154(b) by 0 days.

(21) Appl. No.: 13/835,500

(22) Filed: Mar. 15, 2013

(65) Prior Publication Data

US 2013/0294202 A1   Nov. 7, 2013

Related U.S. Application Data

(60) Provisional application No. 61/641,197, filed on May 1, 2012.

(51) Int. Cl.
*B06B 1/06* (2006.01)
*H01L 41/08* (2006.01)
*H01L 41/047* (2006.01)
*H04R 17/00* (2006.01)
*H01L 41/09* (2006.01)

(52) U.S. Cl.
CPC ............ *H04R 17/00* (2013.01); *H01L 41/0825* (2013.01); *H01L 41/098* (2013.01); *H01L 41/047* (2013.01); *B06B 1/0622* (2013.01); *H01L 41/0475* (2013.01); *B06B 1/0629* (2013.01)
USPC ........................................................ 367/140

(58) Field of Classification Search
USPC ........................................................ 367/140
See application file for complete search history.

(56) References Cited

U.S. PATENT DOCUMENTS

| | | | | |
|---|---|---|---|---|
| 7,477,572 B2* | 1/2009 | Caronti et al. | | 367/140 |
| 7,646,133 B2* | 1/2010 | Degertekin | | 310/309 |
| 2004/0174773 A1 | 9/2004 | Thomenius | | |
| 2005/0203397 A1* | 9/2005 | Degertekin | | 600/437 |
| 2008/0013405 A1 | 1/2008 | Moon et al. | | |
| 2009/0161490 A1* | 6/2009 | Wall et al. | | 367/140 |
| 2010/0268058 A1* | 10/2010 | Chen | | 600/407 |
| 2012/0176002 A1* | 7/2012 | Kim et al. | | 310/317 |

FOREIGN PATENT DOCUMENTS

WO   WO 2007/013814 A2   2/2007

OTHER PUBLICATIONS

International Search Report—PCT/US2013/037382, dated Feb. 4, 2014.

* cited by examiner

*Primary Examiner* — Isam Alsomiri
*Assistant Examiner* — James Hulka
(74) *Attorney, Agent, or Firm* — Blakely, Sokoloff, Taylor & Zafman LLP

(57) ABSTRACT

Piezoelectric micromachined ultrasonic transducer (pMUT) arrays and techniques for frequency shaping in pMUT arrays are described, for example to achieve both high frequency and low frequency operation in a same device. The ability to operate at both high and low frequencies may be tuned during use of the device to adaptively adjust for optimal resolution at a particular penetration depth of interest. In embodiments, various sizes of piezoelectric membranes are fabricated for tuning resonance frequency across the membranes. The variously sized piezoelectric membranes are lumped together by two or more separate electrode rails, enabling independent addressing between the two or more subgroups of sized transducer elements. Signal processing of the drive and/or response signals generated and/or received from each of the two or more electrode rails may achieve a variety of operative modes for the device, such as a near field mode, a far field mode, and an ultra wide bandwidth mode.

20 Claims, 10 Drawing Sheets

MULTI-FREQUENCY ULTRA WIDE BANDWIDTH TRANSDUCER

CROSS-REFERENCE TO RELATED APPLICATIONS

This application claims priority to the U.S. provisional utility patent application titled "MULTI-FREQUENCY ULTRA WIDE BANDWIDTH TRANSDUCER," filed on May 1, 2012 and having application No. 61/641,197, the entire contents of which are incorporated herein by reference for all purposes.

TECHNICAL FIELD

Embodiments of the invention generally relate to piezoelectric transducers, and more specifically pertain to piezoelectric micromachined ultrasonic transducer (pMUT) arrays.

BACKGROUND

An ultrasonic piezoelectric transducer device typically includes a piezoelectric membrane capable of vibrating in response to a time-varying driving voltage to generate a high frequency pressure wave in a propagation medium (e.g., air, water, or body tissue) in contact with an exposed outer surface of the transducer element. This high frequency pressure wave can propagate into other media. The same piezoelectric membrane can also receive reflected pressure waves from the propagation media, and convert the received pressure waves into electrical signals. The electrical signals can be processed in conjunction with the driving voltage signals to obtain information on variations of density or elastic modulus in the propagation media.

While many ultrasonic transducer devices that use piezoelectric membranes are formed by mechanically dicing a bulk piezoelectric material or by injection molding a carrier material infused with piezoelectric ceramic crystals, devises can be advantageously fabricated inexpensively to exceedingly high dimensional tolerances using various micromachining techniques (e.g., material deposition, lithographic patterning, feature formation by etching, etc.). As such, large arrays of transducer elements are employed with individual ones of the arrays driven via beam forming algorithms. Such arrayed devices are known as pMUT arrays.

Generally, for any ultrasonic transducer technology, there is a tradeoff between imaging resolution, which improves with higher frequencies, and penetration depth, which improves lower frequencies. To date, pMUT arrays have limited bandwidth (e.g., fractional bandwidth being well under 1). As such, transducers employing pMUT arrays are typically application specific, with for example Gasrointestinal Ultrasonography requiring a transducer of a first operational frequency band, perhaps 2-6 MHz, and Echocardigraphy requiring a transducer of a second operational frequency band, perhaps 5-13 MHz. A pMUT array capable of multi-frequency operation and/or dynamic frequency tuning would advantageously permit an ultrasonic transducer operator to modulate the operational (transmit and/or receive) frequency band of the transducer while imaging a specimen or patient and eliminate any need to change transducers.

SUMMARY

Multi-frequency pMUT arrays and systems comprising multi-frequency pMUT arrays are described herein. In an embodiment, a pMUT array includes a plurality of piezoelectric transducer element populations disposed over a substrate. Each of the element populations includes at least a first and second transducer element having piezoelectric membranes of differing size, and may contain any number of piezoelectric membranes of various sizes. Each transducer element has a drive/sense electrode coupled to the piezoelectric membrane and to the drive/sense electrodes are coupled a plurality of sets of electrode rails with each set of electrode rails coupled to only one of the transducer element populations. For a given electrode rail set, a first electrode rail is electrically coupled to the drive/sense electrode of the first transducer element (of a first size) while a second electrode rail of the set is electrically coupled to the drive/sense electrode of the second transducer element (of a second size).

With separate drive/sense electrodes, the transducer elements of differing frequency response within a population are addressable independently. As provided in further embodiments, an apparatus for generating and sensing pressure waves in a medium via a multi-frequency pMUT array is to apply a first electrical drive signal on the first electrode rail and a second electrical drive signal on the second electrode rail and/or is to apply first signal processing to a first electrical response signal from the first electrode rail and a second signal processing to a second electrical response signal from the second electrode rail. An ultrasonic transducer apparatus may thereby modulate a frequency response of the pMUT array on the basis of the subgroups within a population of transducer elements. For example, where a first element subgroup includes piezoelectric membranes that are all smaller than a second element subgroup, different frequency response characteristics associated with the differing membrane sizes may be selected and/or tuned by way of the various drive/sense electrode rails provided to a population of transducer elements.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
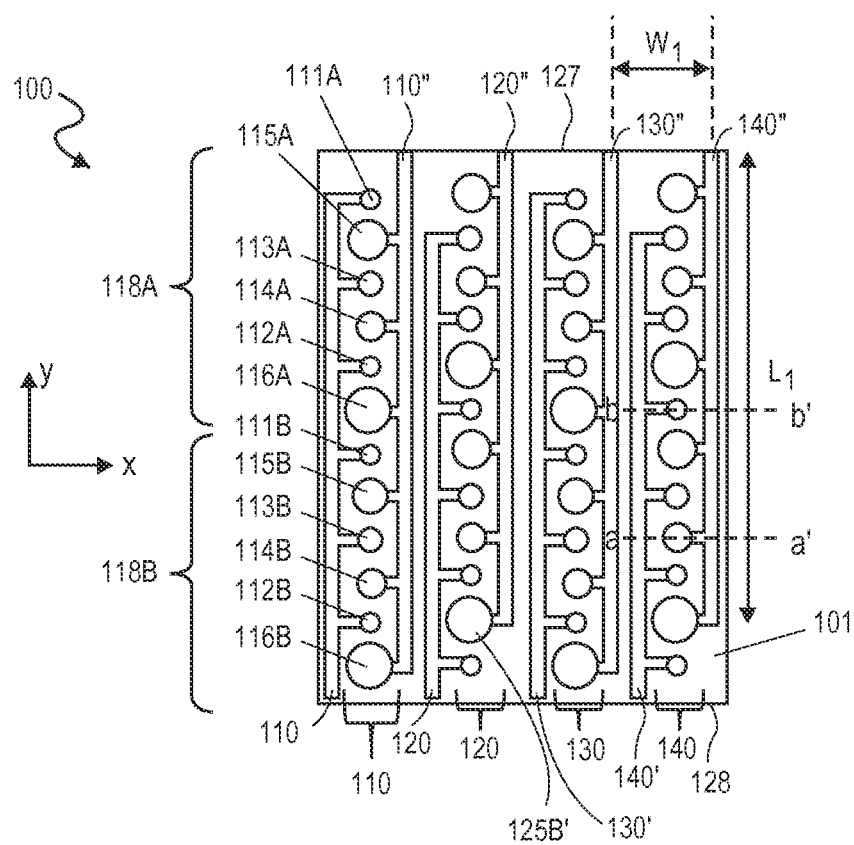
FIG. 1A is a plan view of a dual-frequency 1D pMUT array, in accordance with an embodiment.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Unless specifically stated otherwise, terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

Generally, embodiments described herein leverage a frequency shaping ability of pMUT arrays to achieve both high frequency and low frequency operation in a same device. The ability to operate at both high and low frequencies may be tuned during use of the device to adaptively adjust for optimal resolution at a particular penetration depth of interest. While frequency shaping within a pMUT array may be achieved through a number of techniques, in the exemplary embodiment various sizes of piezoelectric membranes are fabricated for tuning resonance frequency across the membranes. The variously sized piezoelectric membranes are then grouped or lumped together by two or more electrode rails, enabling independent addressing between the two or more groupings of sized transducer elements. Signal processing of the drive and/or response signals generated and/or received from each of the two or more electrode rails can then achieve a variety of operative modes for the device, such as a near field mode, a far field mode, and an ultra wide bandwidth mode.

FIG. 1A is a plan view of a pMUT array 100, in accordance with an embodiment. In an embodiment, a pMUT array includes a plurality of piezoelectric transducer element populations disposed over a substrate. Each piezoelectric transducer element population is to operate as a lumped element with a frequency response that is a composite of the individual transducer elements within each element population. Generally, any number of piezoelectric transducer elements may be lumped together as a population, depending the array area and element pitch. In the embodiment depicted in FIG. 1A, each piezoelectric transducer element population (e.g., 110) forms a linear array along the y dimension with piezoelectric transducer elements aligned in single file (i.e., with centers aligned along a straight line) over a length $L_1$ of the substrate that is at least five times, and preferably at least an order of magnitude, larger than a width $W_1$ of the substrate. Other geometries over which an element population is arrayed are also possible with the guiding principle being that each element population in the pMUT array is to have a known spatial relationship within the array such that beam forming techniques can be applied at the population level. For the exemplary embodiment of FIG. 1A, beam forming techniques may be readily applied with the element populations 110, 120, 130, 140 forming a 1D array along the x direction.

In an embodiment, each element population includes at least a first and second transducer element having piezoelectric membranes of differing size. Spectral response may be shaped by integrating different membrane sizes (e.g., membrane diameters for the exemplary circular or spheriodal membranes described elsewhere herein). Unlike bulk PZT transducers, the resonance frequency of a pMUT can be readily tuned by geometry through lithography. In further embodiments, each transducer element population includes an identical set of transducer element sizes so that the spectral response from each population is approximately the same.

Generally, any number of different membrane sizes may be utilized within an element population (e.g., 2-20 different membrane sizes (e.g., diameters), or more). As illustrated by FIG. 1A, each drive/sense electrode (e.g., 110') is coupled to transducer elements having three different sizes (e.g., 111A, 112A, 113A.) The range of diameters will generally depend on the desired frequency range as a function of membrane stiffness and mass. Increments between successively larger membranes may be a function of the range and number of differently sized membranes with less frequency overlap occurring for larger size increments. An increment size can be selected to ensure all transducer elements contribute to response curve maintaining a 3 dB bandwidth sufficient for a desired operational mode. As an example, for a near field operational mode, transducer diameters in the range of 20-150 μm would be typical for MHz frequency responses from a transducer having the general structure described in the context of FIGS. 2A-2C. A diameter increment of 2-10 μm would typically provide sufficient response overlap to provide a cumulative response with 3 dB bandwidth.

In an embodiment, a pMUT array includes a plurality of electrode rail sets, with each set of electrode rails coupled to only one of the transducer element populations. Generally, within a given element population, drive/sense electrodes of individual transducer element's are electrically coupled in parallel to one of at least two separate drive/sense electrode rails so that all element drive/sense electrodes coupled to one drive/sense rail are at a same electrical potential. With two separate drive/sense electrode rails for each transducer element population, a first electrode rail is electrically coupled to the drive/sense electrode of a first transducer element and a second electrode rail is electrically coupled to a drive/sense electrode of a second transducer element. For example in FIG. 1, the element population 110 includes transducer elements 111A, 112A, 113A, 111B, 112B and 113B with drive/sense electrodes coupled to the drive/sense electrode rail 110', while elements 114A, 115A, 116A, 114B, 115B, and 116B have drive/sense electrodes coupled to the drive/sense electrode rail 110". Similarly, drive/sense electrodes of the transducer element population 120 are coupled in parallel to the drive/sense electrode rails 120' or 120".

Each drive/sense electrode rail (e.g., 110') is electrically addressable independently from any other drive/sense electrode rails (e.g., 110" or 120', etc.). Both the drive/sense electrode rails and a reference (e.g., ground) electrode rail are depicted in the cross-sectional views of FIG. 2A-2C. In FIG. 1A, the drive/sense electrode rail 110' and drive/sense electrode rail 110" represent a repeating cell in the array. For example, for the transducer element population 110, the first drive/sense electrode rail 110' is coupled to a first end 127 and the second drive/sense electrode rail 110" is coupled a second end 128 to form an interdigitated finger structure. The drive/sense electrode rail 120' and drive/sense electrode rail 120" repeat the interdigitated structure with additional cells forming a 1D electrode array of arbitrary size (e.g., 256 electrode rails for 128 populations, etc.).

In an embodiment, drive/sense electrode rails corresponding to a same transducer element population are coupled to transducer elements of different, non-overlapping size ranges. For example, where a population of n transducer elements includes piezoelectric membranes of i different sizes, with i=1, 2, 3, 4, 5 and 6 covering a range of increasingly larger membrane diameters, a first drive/sense electrode rail is coupled to the membranes of size i=1-3 while a second drive/sense electrode rail is coupled to the membranes of size i=4-6. As further illustrated in FIG. 1A, transducer elements 111A, 112A and 113A, together being the three smallest membranes, are all coupled to the drive/sense electrode rail 110'. Similarly, transducer elements 114A, 115A, and 11BA, together being the three largest membranes, are all coupled to the drive/sense electrode rail 110". As further described elsewhere herein, this separation of an element population into m subgroups (m being the numbered of drive/sense rails in one set of rails), enables a pMUT array to operate in different frequency bands (i.e., multi-hertz operation).

In an embodiment, each element population includes a plurality of first transducer elements with a piezoelectric membrane of a first size and includes a plurality of second transducer elements with a piezoelectric membrane of a second size. As the number of different transducer element (i.e., membrane) sizes increases, the resolution at a particular center frequency can be expected to go down as the distance between elements of a same size increases. For example, where piezoelectric membranes of each piezoelectric transducer element population are in single file, effective pitch of same-sized transducers along the length $L_1$ is reduced with each additional transducer size in the population. Including more than one piezoelectric transducer element of each nominal membrane size within each piezoelectric transducer element population can improve resolution. For the exemplary embodiment depicted in FIG. 1A, the drive/sense electrode rail 110' is electrically coupled to piezoelectric transducer elements 111A and 111B of a first size (e.g., smallest diameter membrane), elements 112A, 112B of a second size (e.g., next to smallest diameter membrane), and elements 113A, 113B of three different membrane sizes. Similarly, the drive/sense electrode rail 110" is electrically coupled to the drive/sense electrode of each of the first transducer elements 114A and 114B of a first size (e.g., largest diameter membrane).

In the exemplary embodiment a transducer element subgroup 118A is repeated as 118B along the length of the substrate 101 over which the element population 110 is disposed. Each transducer element subgroup 118A, 118B includes one piezoelectric transducer element of each nominal membrane size coupled to one of the first or second electrode rail 110' and 110". As such, the subgroup 118A represents a minimum repeating unit cell of the pMUT array 100. In this exemplary embodiment, the spatial layout ensures the element population coupled to the drive/sense rails 110' and 110" has transducer elements of a same size (e.g., 111A and 111B) spaced apart by at least one intervening element of a different size, but are spaced apart by no more than a length of the substrate occupied by one element subgroup. This has the effect of improving the uniformity of signal. It is also advantageous to space out elements of a same size by a same amount such that resolution is comparable across the frequency response band. In further embodiments, and as also illustrated by FIG. 1A, transducer elements (e.g., 111A-114A) coupled to a first electrode rail (e.g., 110') are spaced apart by transducer elements (e.g., 115A) coupled to a second electrode rail (e.g., 110"). This interdigitation of the drive/sense electrode rail pairs ensures the spatial distribution of the element population is uniform between the pairs of drive/sense electrode rails.

Figure 2A:
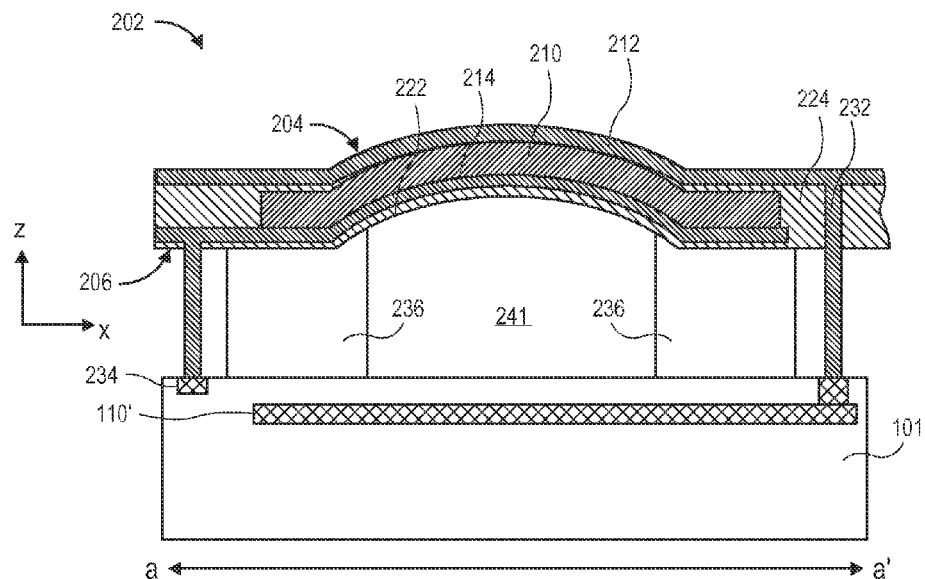
FIGS. 2A, 2B, and 2C are cross sectional views of transducer elements that may be employed in any of the pMUT arrays of FIGS. 1A-1B, in accordance with an embodiment.
Figure 2B:
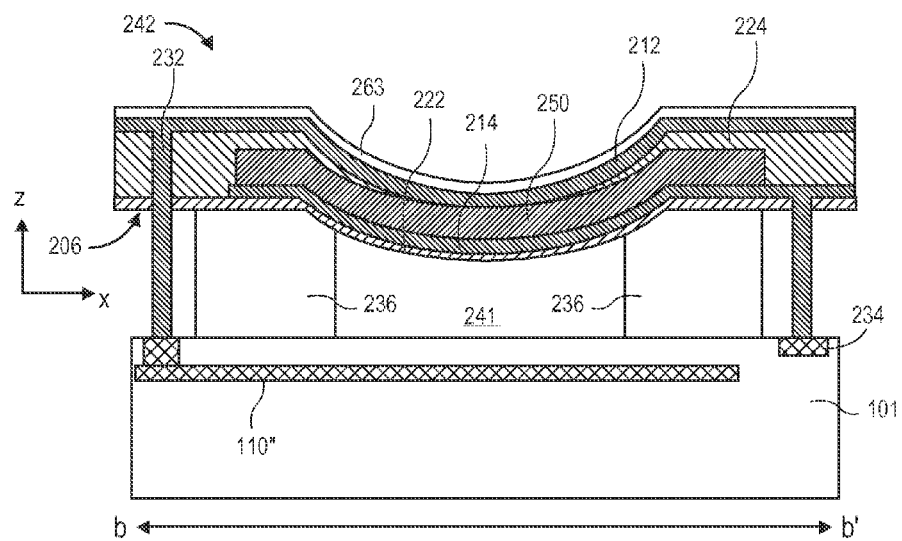
Figure 2C:
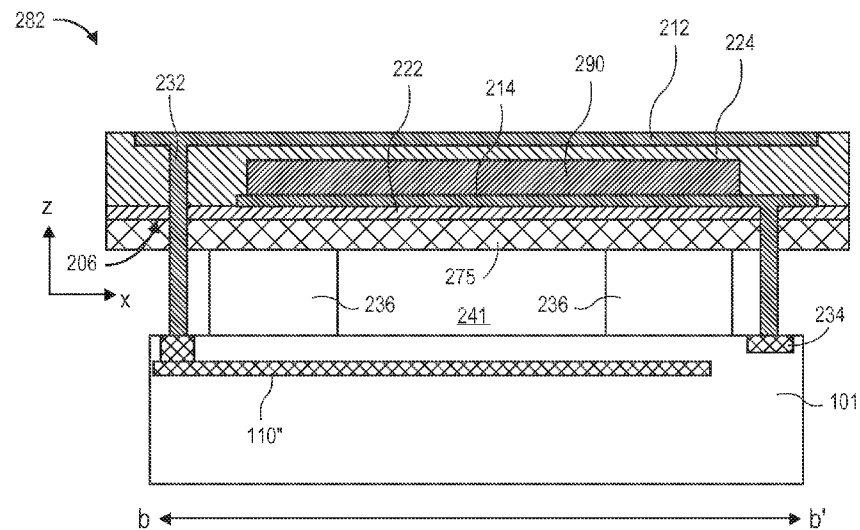

Exemplary micromachined (i.e., microelectromechanical) aspects of individual transducer elements are briefly described in the context of FIGS. 2A-2C. It is to be appreciated that the structures depicted in FIGS. 2A-2C are included primarily as context for particular aspects of the present invention and to further illustrate the broad applicability of the present invention with respect to piezoelectric transducer element structure. FIGS. 2A, 2B, and 2C are cross-sectional views of transducer element embodiments, any of which may be utilized in the pMUT array 100, in accordance with embodiments. FIG. 2A corresponds to a cross-section along the a-a' line in FIG. 1A, while the FIGS. 2B and 2C correspond to a cross-section along the b-b' line in FIG. 1A.

In FIG. 2A, a convex transducer element 202 includes a top surface 204 that during operation forms a portion of a vibrating outer surface of the pMUT array 100. The transducer element 202 also includes a bottom surface 206 that is attached to a top surface of the substrate 101. The transducer element 202 includes a convex or dome-shaped piezoelectric membrane 210 disposed between a drive/sense electrode 212 and a reference electrode 214 (i.e., the piezoelectric membrane 202 has a spheriodal geometry). In one embodiment, the piezoelectric membrane 210 is formed by depositing (e.g., sputtering) piezoelectric material particles in a uniform layer on a profile-transferring substrate (e.g., photoresist) that has a dome formed on a planar top surface, for example. An exemplary piezoelectric material is Lead Zirconate Titanate (PZT), although any known in the art to be amenable to conventional micromachine processing may also be utilized, such as, but not limited to doped polymethylrnethacrylate (PMM) polymer particles, and aluminum nitride (AlN). The drive/sense electrode and reference electrode 212, 214 can each be a thin film layer of conductive material deposited (e.g., by PVD, ALD, CVD, etc.) on the profile-profile transferring substrate. The conductive materials for the drive/sense electrode can be any known in the art for such function, such as, but not limited to, one or more of Au, Pt, Ni, Ir, etc.), alloys thereof (e.g., AuSn, IrTiW, AuTiW, AuNi, etc.), oxides thereof (e.g., $IrO_2$, $NiO_2$, $PtO_2$, etc.), or composite stacks of two or more such materials.

As further shown in FIG. 2A, in some implementations the transducer element 202 can optionally include a thin film layer 222, such as silicon dioxide that can serve as a support and/or etch stop during fabrication. A dielectric membrane 224 may further serve to insulate the drive/sense electrode 214 from the reference electrode 212. Vertically-oriented electrical interconnect 232 connects the drive/sense electrode 212 to drive/sense circuits via the first drive/sense electrode rail 110'. A similar interconnect couples the reference electrode 214 to a reference electrode rail 234, which may for example couple to all transducer elements of a population. An annular support 236, having a hole 241 with an axis of symmetry defining a center of the transducer element 202, mechanically couples the piezoelectric membrane 210 to the substrate 101. The support 236 may be of any conventional material, such as, but not limited to, silicon dioxide, polycrystalline silicon, polycrystalline germanium, SiGe, and the like. Exemplary thicknesses of support 236 range from 10-50 μm and exemplary thickness of the membrane 224 range from 2-20 μm.

FIG. 2B shows another exemplary configuration for a transducer element 242 in which structures functionally similar to those in transducer element 202 are identified with like reference numbers. The transducer element 242 illustrates a concave piezoelectric membrane 250 that is concave in a resting state (i.e., the piezoelectric membrane 250 has a spheriodal geometry). Here, the drive/sense electrode 212 is coupled to the second drive/sense electrode rail 110".

FIG. 2C shows another exemplary configuration for a transducer element 282 in which structures functionally similar to those in transducer element 202 are identified with like reference numbers. The transducer element 262 illustrates a planar piezoelectric membrane 290 that is planar in a resting state, and unlike the elements 202, 242, operates in bending mode and therefore further includes a membrane 575 (typically of silicon). Here, the drive/sense electrode 212 is disposed over a top surface of the planar piezoelectric membrane 290, while the reference electrode 214 is disposed below a bottom membrane surface. An opposite drive/sense electrode and reference electrode configuration from that depicted in each of FIGS. 2A-2C is of course also possible (i.e., drive/sense electrode disposed below a piezoelectric membrane).

Figure 1B:
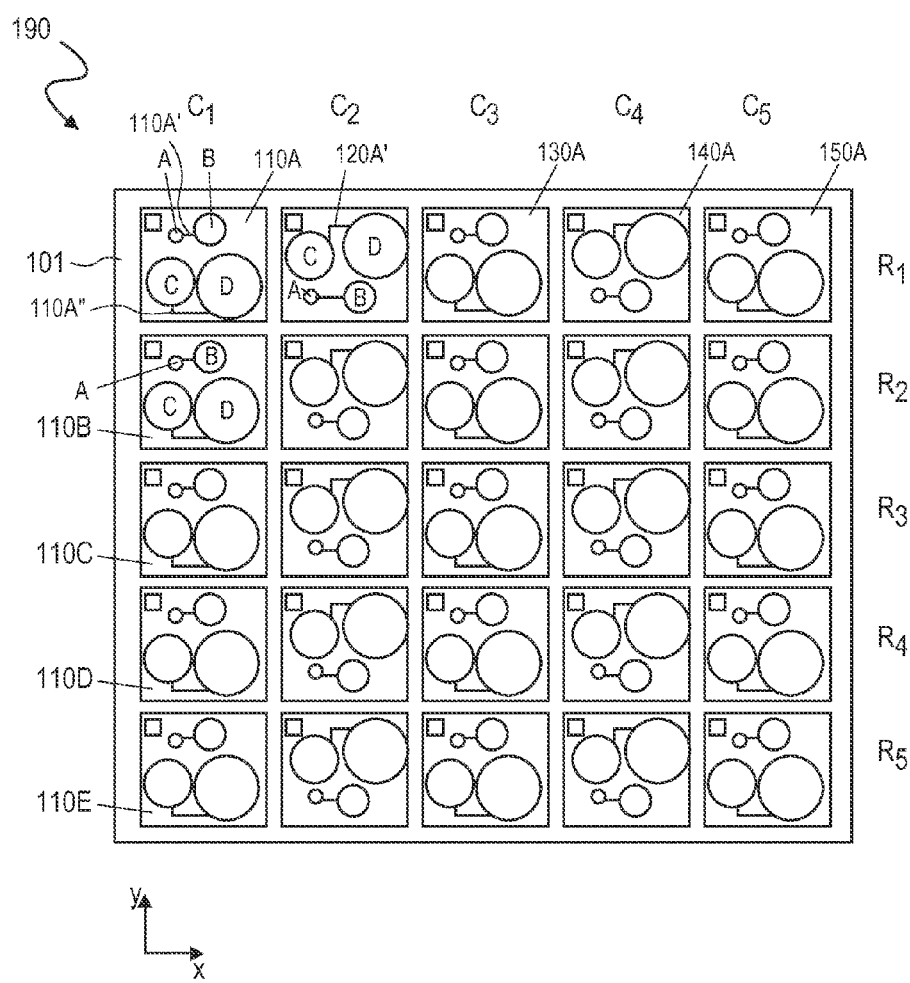
FIG. 1B is a plan view of a dual-frequency 2D pMUT array, in accordance with an embodiment.

In an embodiment, a plurality of sets of electrode rails forms a two-dimensional array of electrode rails along a first and second dimension of the substrate. While FIG. 1A illustrates an exemplary 1D pMUT array 100, the FIG. 1B is a plan view of an exemplary 2D pMUT array 190. Within each transducer element population are transducer elements A, B, C, and D of differing sizes, in accordance with an embodiment. As shown, tiled over a substrate 101 are a plurality element populations 110A, 110B, 110C, etc. forming a column $C_1$ in the y-dimension and 110A, 120A, 130, etc. forming a row $R_1$ in the x-dimension. The rows R1-R5 and C1-C5 therefore provide a 5×5 array of element populations. Like the 1D pMUT array 100, the 2D pMUT array 190 includes at least two drive/sense electrode (e.g., 110A' and 110A") coupled to separate ones of the transducer elements (e.g., 110A' coupled to elements A,B and 110A" coupled to elements C,D) in each population (e.g., 110A).

Figure 1C:
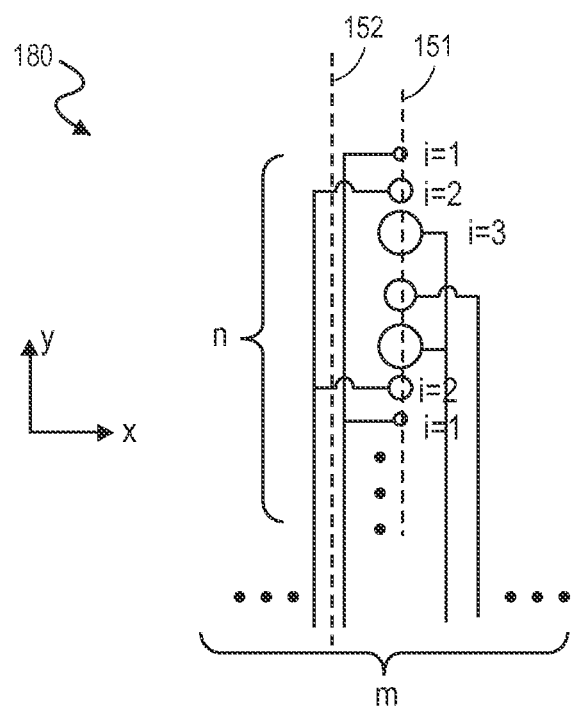
FIG. 1C is a plan view of a multi-frequency pMUT population, in accordance with an embodiment.

While FIG. 1A illustrates an exemplary embodiment where elements of a population are coupled to a pair of drive/sense electrodes (e.g., 110' and 110"), FIG. 1C illustrates more generally that a population 180 of n transducer elements of i different sizes may be coupled to m separate drive/sense electrodes. As in the array 100, the transducer element population 180 forms a linear array with all transducer elements centered about a longitudinal population axis 151 with drive/sense electrode rails having a parallel longitudinal axis 151. While the drive/sense electrode rail routing is generally a matter of design choice, the drive/sense electrode rails shown in FIGS. 1A and 1C are advantageously routed between adjacent element population to reduce electromechanical coupling between populations and thereby reduce crosstalk.

With m drive/sense electrode rails, operation of a pMUT array may be modulated to emphasize one or more of the frequency bands corresponding to the element size i that is coupled to a given drive/sense electrode rail. While it is possible a population of n transducer elements may have m=n drive/sense electrodes, because of limitations in feature pitch and sensitivity, m is preferably less than n. Where the transducer element population includes j>1 transducer elements of a same size, transducers of the same size within an element population are to be coupled to a same drive/sense electrode rail so as to maintain the ability tailor the spectral response of the population through separate manipulation of the distinct drive/sense electrodes. Furthermore, where each of the m drive/sense electrode rails are coupled to transducer elements of more than one size (i.e., i>1), the frequency band associated with each rail becomes an aggregate response of the transducer elements of various size. For example, a first subset of the i transducer elements having a first range of membrane sizes (e.g., diameters) are to output to the first electrode rail y differing frequency responses that are all of a lower frequency than i-y differing frequency responses output to the second electrode rail by a second subset of the i transducer elements. As such, the number of m drive/sense electrode specifies the number of different frequency bands over which a given array may operate (e.g., m=2 for dual-frequency mode operation and m>2 for any other multi-mode).

Figure 1D:
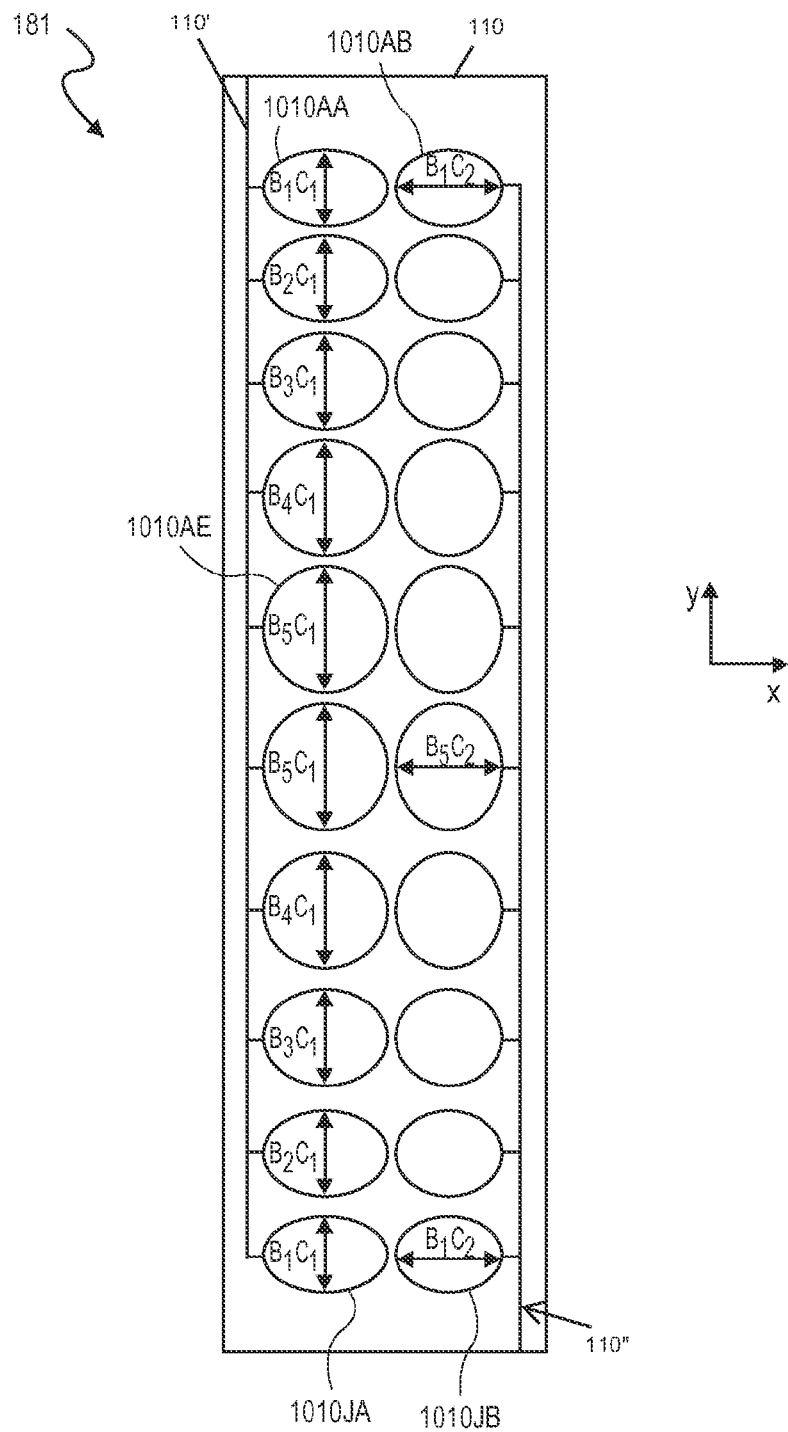
FIG. 1D is a plan view of a dual-frequency 1D pMUT array with elliptical membranes and graduating sizes within each frequency band, in accordance with an embodiment.

In other rotationally symmetric membrane embodiments, the membranes are elliptical. Elliptical membrane embodiments (or ellipsoidal embodiments where the membrane has a non-planar resting state as described elsewhere herein) potentially offer a greater fill factor and by reducing the rotational symmetry from all rotation angles for a circular or spheroidal membrane down to only 2-fold symmetry (180°), mode shapes can be readily split into more distinct modes having separated resonant frequencies. FIG. 1D is a plan view of a dual-frequency 1D pMUT array 181 with elliptical membranes and graduating sizes within each frequency band, in accordance with an embodiment. As shown, a channel 110 of a transducer includes a first electrode rail 110' coupled to elliptical membranes 1010AA-1010JA, all having a first axis $C_1$ and a gradually changing second axis $B_1$-$B_5$. The channel 100 further includes a second electrode rail 110" coupled to elliptical membranes 1010AB-1010JB, all having a second axis $C_2$ and also the gradually changing second axis $B_1$-$B_5$. As such, the first electrode rail 110' is coupled to a group of membranes of larger size than the second electrode rail 110". The B axis incremented from $B_1$, up to $B_5$, and then back down to $B_1$ for elements 1010AA, 1010AE, 1010JA, respectively, along one dimension of the array (e.g., the y-axis of the substrate). Hence, the membrane size gradually increases and/or decreases in a step-wise manner through adjacent elements coupled to the rail 110' or 110". Graduating membrane size over a distance of the array has been found to mitigate deconstructive phasing between first and second membranes of drastically differing size. Thus, where a population of membranes coupled to an electrode rail are of different sizes, it is advantageous to spatially arrange the population over the substrate so as to have the difference in size between any two adjacent membranes be smaller than the difference in size between the largest and smallest membranes in the population.

Figure 3:
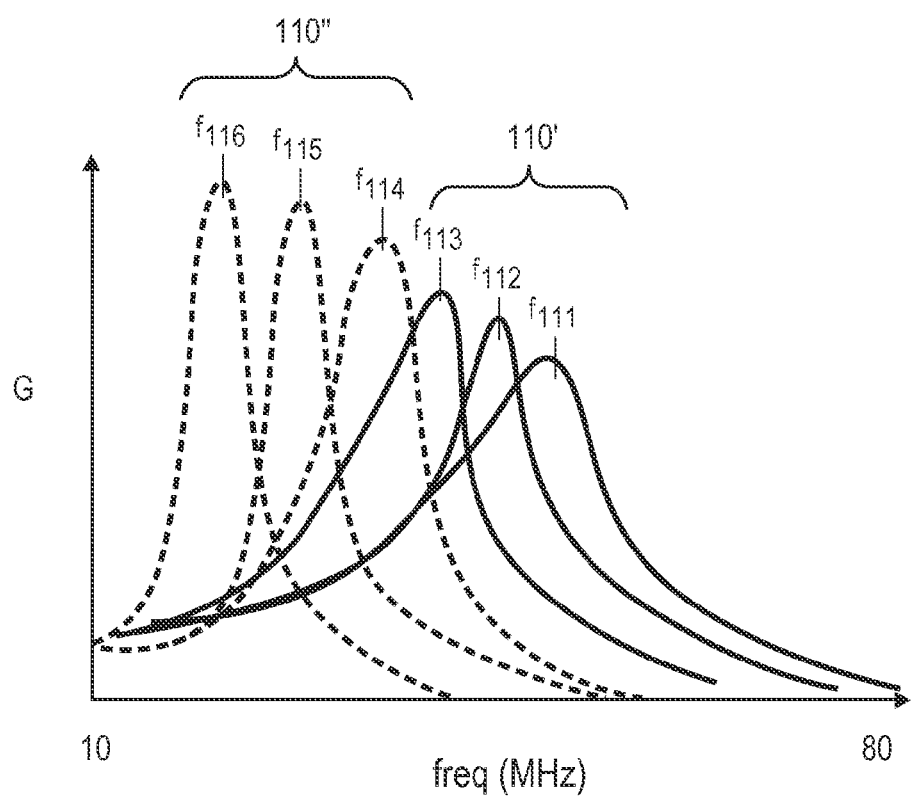
FIG. 3 is a graph depicting the frequency response curves for transducer elements in the dual-frequency pMUT array of FIG. 1A, in accordance with an embodiment.

FIG. 3, is a graph depicting the cumulative frequency response curves for one population of transducer elements in the dual-frequency pMUT array 100, in accordance with an embodiment. In FIG. 3, the frequency responses are for a reference electrical drive signal applied to both the electrode rails 110' and 110". For example, the drive signal applied to the drive/sense electrode rail 110' has a time varying voltage waveform of a same reference amplitude as that applied to the drive/sense electrode rail 110". Similarly, the frequency responses illustrated in FIG. 3 correspond to a same signal processing. For example, a same amplification factor is applied to each of the response signals received on each of the electrode rails 110' and 110". As shown, frequency responses having increasing center frequencies of $F_{116}$, $F_{115}$, and $F_{114}$ correspond to resonance frequencies of different sized transducer elements 116A,B, 115A,B and 114A,B, respectively, as drive and sensed by the drive/sense electrode rail 110". Similarly, second frequency responses having increasing center frequencies of $F_{113}$, $F_{112}$, and $F_{111}$ correspond to resonance frequencies of different sized transducer elements 113A,B, 112A,B and 111A,B, respectively, as received by the drive/sense electrode rail 110'. Because the sensitivity of piezoelectric transducer elements generally declines with decreasing piezoelectric membrane size, the power gain is illustrated as declining with increasing frequency.

Figure 4A:
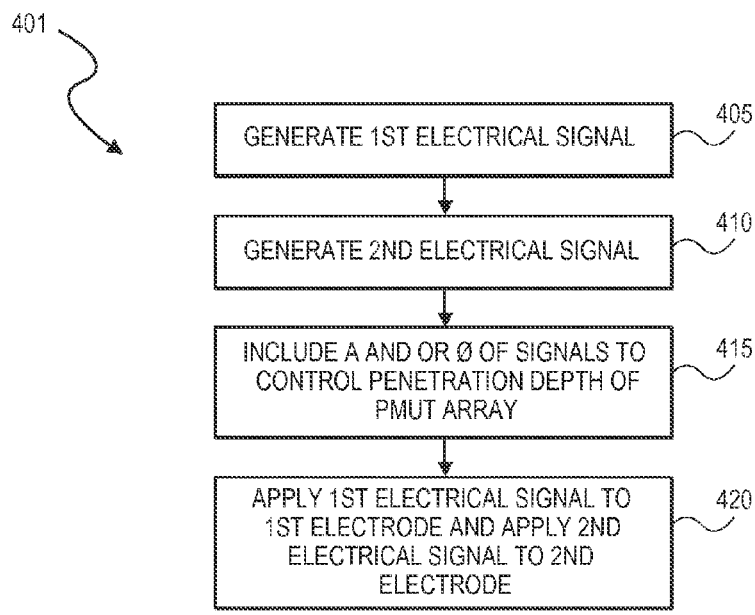
FIG. 4A is a flow chart of a method to drive signals on the dual-frequency pMUT array of FIG. 1A, in accordance with embodiments.
Figure 4B:
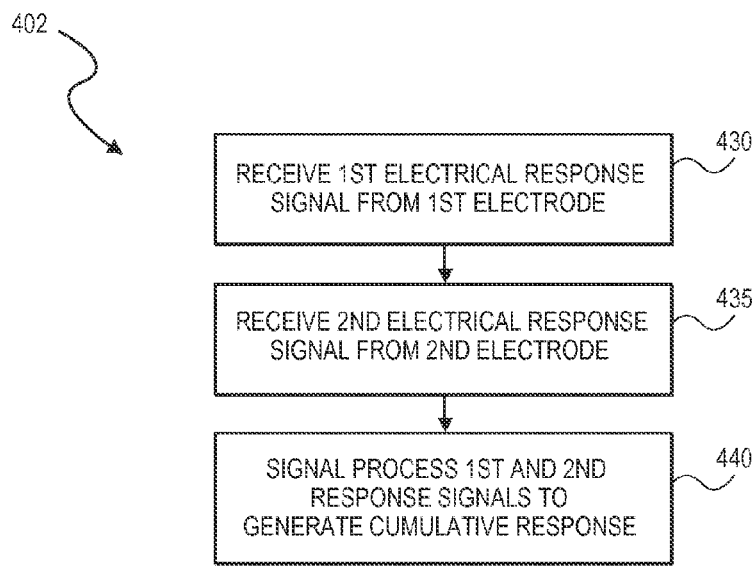
FIG. 4B is a flow chart of a method to receive response signals from the dual frequency pMUT array of FIG. 1A, in accordance with embodiments.

FIG. 4A is a flow chart of a transmit method 401 for driving signals on the dual-frequency pMUT array 100, in accordance with embodiments. FIG. 4B is a flow chart of a receive method 402 for sensing signals from the dual frequency pMUT array 100, in accordance with embodiments. Generally, the methods 401 and 402 are examples of how independent access to subgroups of a transducer element population having differing characteristic frequency responses can be leveraged through independent drive signal conditioning, independent response signal conditioning, or both, to operate the pMUT 100 in one of a variety of modes. The methods 401 and 402 may apply any beamforming techniques typically utilized between electrode rails of separate transducer element populations to achieve in the present embodiments control over the frequency response of a single transducer element population. A salient distinction between convention beamforming techniques and the methods 401 and 402 is that the methods 401 and 402 are applied between subgroups of one element population having different frequency responses whereas conventional beamforming techniques would be performed between electrodes having essentially the same frequency responses. Thus, where the characteristic frequency responses for a pMUT array are as previously described (e.g., in FIG. 3), the methods 401 and 402 serve to modulate frequency responses of element populations within a pMUT array (e.g., pMUT array 100).

The methods 401 and 402 may be applied automatically in response to receiving a user's command to dynamically select an operative mode for an apparatus for generating and sensing pressure waves in a medium, or the methods 401 and 402 may be automatically applied as a means of pre-configuring such an apparatus for a particular operative mode, for example as a field service, etc. At operation 405 a first electrical drive signal is generated, and at operation 410 a second electrical drive signal is generated. Any means for generating a drive signal known in the art to be applicable for separate drive/sense electrodes in a pMUT may be employed at the operations 405 and 410, an exemplary hardware for which is further described in the context of FIG. 6. The second electrical drive signal may be a derivative of the first, or separately generated, but is to have a known phase relative to the first electrical drive signal. At operation 415, amplitude (A) or phase (φ) of the first and second electrical drive signals are modulated relative to each other to control a penetration depth of a pMUT array. In further embodiments, frequency of the first and second electrical drive signals may also be different (e.g., of separate non-overlapping bands). Techniques for modulating amplitude and phase are well-known in the context of conventional beamforming techniques, and any such technique may be applied toward the specific objective of penetration depth control. At operation 420, the first and second electrical signals, as modulated, are then applied to the first and second electrode rails coupled to separate transducer elements of a given transducer element population.

The receiver method 402 entails receiving first and second electrical response signals from the first and second drive/sense electrode rails at operation 430 and 435, and signal processing the first and second response signals independently to generate a cumulative response for a given transducer element population. The goal of the signal processing at 440 is to tailor the frequency responses as separate frequency bands to either maximize a total bandwidth (e.g., for 3 dB corner frequencies) of the transducer element population, or to emphasize one of the frequency response bands over the other for far field or near field modes.

Figure 5A:
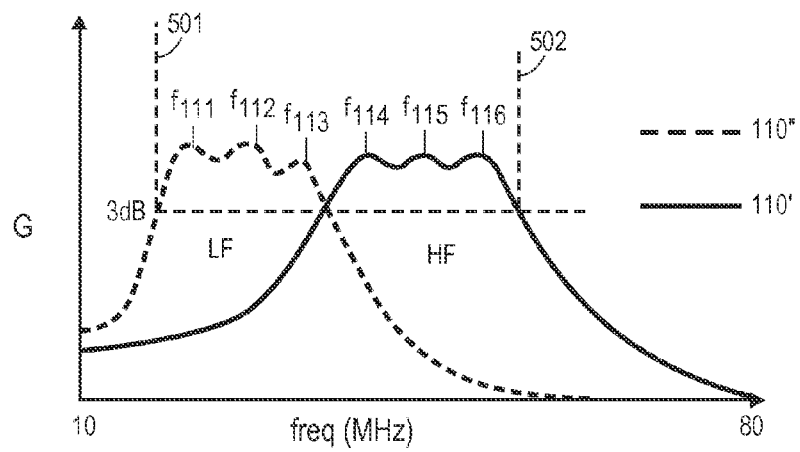
FIG. 5A is a graph depicting a cumulative frequency response for the dual-frequency pMUT array of FIG. 1A operated in an ultra wide bandwidth mode, in accordance with an embodiment.

FIG. 5A is a graph depicting a cumulative frequency response for the dual-frequency pMUT array 100 (FIG. 1A) operated in an ultra wide bandwidth mode, in accordance with an embodiment. In an ultra wide bandwidth mode, the electrical drive and response signals to and from a given transducer element population are independently modulated to maximize the bandwidth of the cumulative response. FIG. 5A shows a cumulative frequency response with a bandwidth for 3 dB corners 501, 502. Assuming the natural frequency responses for the pMUT array 100 are as depicted in FIG. 3, without independent modulation of the drive and/or response signals, the high frequency subgroup of transducer elements (e.g., including a smallest piezoelectric membrane) coupled to the drive/sense electrode 110' would have insufficient power gain to fall within 3 dB of the most sensitive transducer element (e.g., including a largest piezoelectric membrane) in the low frequency subgroup. For example, as shown in FIG. 3, $f_{111}$ is not within 3 dB of $f_{116}$.

Through application of methods 401 and 402, one or more of applied drive voltage, phase difference, or response signal amplification is increased for the drive/sense electrode 110' (e.g., larger voltage amplitude, different phase, or larger amplification factor) relative to the drive voltage and/or response signal amplification applied to drive/sense electrode 110" to bring the power gain of the less sensitive high frequency (HF) transducer subgroup up to within 3 dB of the more sensitive low frequency (LF) transducer subgroup. As shown in FIG. 5A, $f_{111}$ is brought up to within 3 dB of $f_{116}$ to extend the cumulative response bandwidth beyond that of either of the LF and HF bandwidths individually.

Figure 5B:
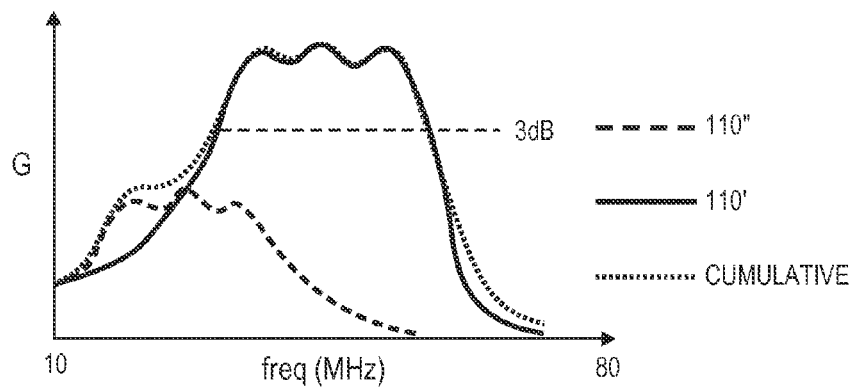
FIG. 5B is a graph depicting a cumulative frequency response for the dual-frequency pMUT array of FIG. 1A operated in a near field mode, in accordance with an embodiment.

FIG. 5B is a graph depicting a cumulative frequency response for the dual-frequency pMUT array 100 (FIG. 1A) operated in a near field mode, in accordance with an embodiment. In a near field mode, the electrical drive and response signals to and from a given transducer element population are independently modulated to maximize near field resolution for the transducer element population subgroup having the highest aggregate frequency response. Assuming the natural frequency responses for the pMUT array 100 are as depicted in FIG. 3, without independent modulation of the drive and/or response signals, the low frequency subgroup of transducer elements coupled to the drive/sense electrode 110" would have too much power gain to provide a near field image and would instead tend to provide more far field sensitivity. However, through application of methods 401 and 402, one or more of applied drive voltage or response signal amplification is increased for the drive/sense electrode 110' relative to that of the drive/sense electrode 110". For example, a smaller voltage amplitude (e.g., 0 V or some nominal non-zero voltage), or smaller amplification factor may be applied to the drive/sense electrode 110" relative to the drive voltage and/or response signal amplification applied to drive/sense electrode 110' to bring the power gain of the naturally more sensitive transducer subgroup (LF group) down below 3 dB of the most sensitive element in the less sensitive HF transducer subgroup. For example, as shown in FIG. 5B, $f_{116}$ is more than 3 dB below the most sensitive transducer element in LF transducer subgroup so that the frequency response from any given transducer element population in the pMUT array has a center frequency in the range of 5-13 MHz, useful, for example, in echocardiography applications.

Figure 5C:
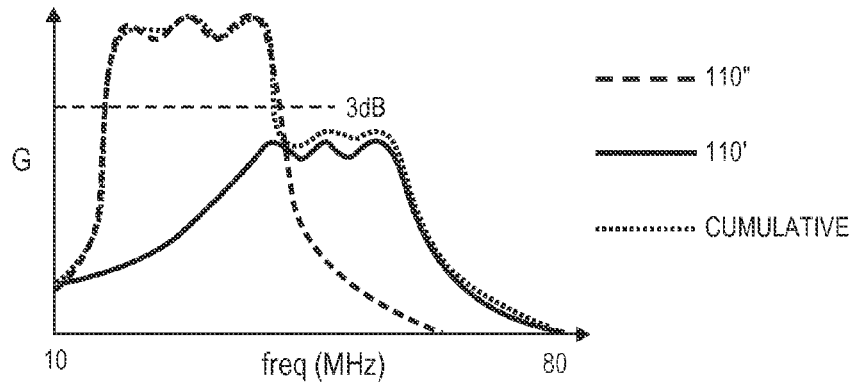
FIG. 5C is a graph depicting a cumulative frequency response for the dual-frequency pMUT array of FIG. 1A operated in a far field mode, in accordance with an embodiment.

FIG. 5C is a graph depicting a cumulative frequency response for the dual-frequency pMUT array 100 (FIG. 1A) operated in a far field mode, in accordance with an embodiment. In a far field mode, the electrical drive and response signals to and from a given transducer element population are independently modulated to maximize far field resolution for the transducer element population subgroup having the lowest aggregate frequency response. Assuming the natural frequency responses for the pMUT array 100 are as depicted in FIG. 3, without independent modulation of the drive and/or response signals, the most sensitive of the HF subgroup of transducer elements coupled to the drive/sense electrode 110' would have too much power gain to provide a far field image and would instead include significant near field sensitivity. With properly selected membrane diameters for each of the separate drive/sense electrodes, far field image resolution can be tailored to any depth by truncating the transducer element response associated with near field sensitivity through signal conditioning. Through application of methods 401 and 402 for example, one or more of applied drive voltage or response signal amplification is decreased for the drive/sense electrode 110' relative to that of the drive/sense electrode 110". For example, a smaller voltage amplitude (e.g., 0 V or some nominal non-zero voltage), or smaller amplification factor may be applied to the drive/sense electrode 110' relative to the drive voltage and/or response signal amplification applied to drive/sense electrode 110" to bring the power gain of even the most sensitive transducer element of the low sensitivity subgroup (HF) down below 3 dB of the most sensitive element in the LF transducer subgroup. For example, as shown in FIG. 5C, $f_{111}$ is more than 3 dB below the most sensitive transducer element in low frequency transducer subgroup so that the frequency response from any given transducer element population in the pMUT array has a center frequency in the range of 2-6 MHz, useful, for example, in Gasrointestinal Ultrasonography applications.

Notably, while the methods 401 and 402 and frequency response tuning illustrated in FIGS. 5A-5C are described in the context of a drive/sense electrode rail set that includes two drive/sense electrode rails coupled to each transducer element population, it is understood that these exemplary methods and the associated frequency responses are merely a simplest form of the pMUT embodiments described herein with the same methods also being applicable for embodiments employing more than two drive/sense electrode rails to achieve multi-frequency response tuning across more than two frequency bands.

Figure 6:
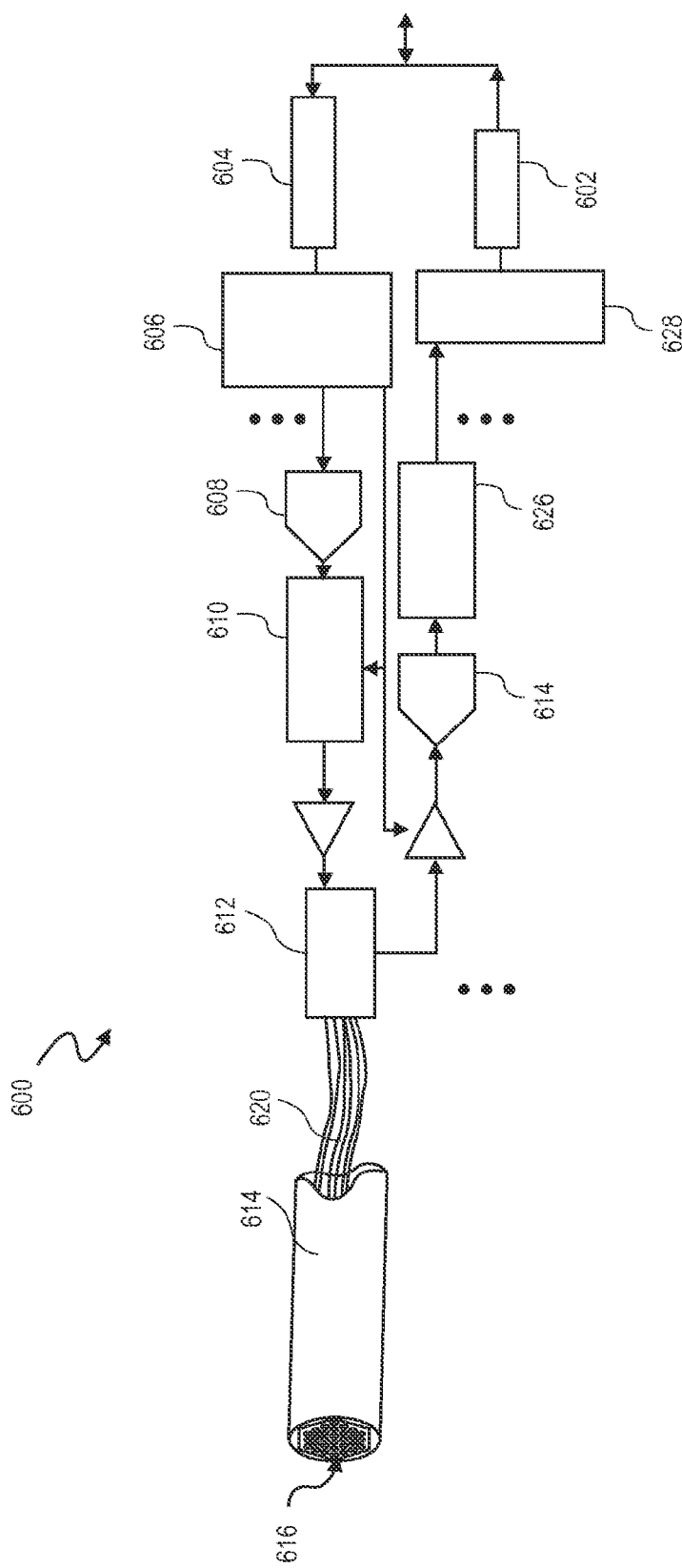
FIG. 6 is a functional block diagram of an ultrasonic transducer apparatus which employs a multi-frequency pMUT array, in accordance with an embodiment of the present invention.

FIG. 6 is a functional block diagram of an ultrasonic transducer apparatus 600 that employs a pMUT array, in accordance with an embodiment of the present invention. In an exemplary embodiment, the ultrasonic transducer apparatus 600 is for generating and sensing pressure waves in a medium, such as water, tissue matter, etc. The ultrasonic transducer apparatus 600 has many applications in which imaging of internal structural variations within a medium or multiple media is of interest, such as in medical diagnostics, product defect detection, etc. The apparatus 600 includes at least one pMUT array 616, which may be any of the pMUT arrays described elsewhere herein having at least two drive/sense electrodes for each element population. In exemplary embodiment, the pMUT array 616 is housed in a handle portion 614 which may be manipulated by machine or by a user of the apparatus 600 to change the facing direction and location of the outer surface of the pMUT array 616 as desired (e.g., facing the area(s) to be imaged). Electrical connector 620 electrically couples each drive/sense electrode rails as separate channels of the pMUT array 616 to a communication interface external to the handle portion 614.

In embodiments, the apparatus 600 includes at least one signal generator, which may be any known in the art for such purposes, coupled to the pMUT array 616, for example by way of electrical connector 620. The signal generator is to provide an electrical drive signal on various drive/sense electrodes. In one specific embodiment, a first signal generator is to apply a first electrical drive signal to cause some elements within the piezoelectric transducer element populations to resonate at frequencies between 2 MHz and 6 MHz while a second signal generator is to apply a second electrical drive signal to cause other elements in the piezoelectric transducer element populations to resonate at frequencies between 5 MHz and 13 MHz. In an embodiment, each signal generator includes a de-serializer 604 to de-serialize control signals that are then de-multiplexed by demux 606. The exemplary signal generate further includes a digital-to-analog converter (DAC) 608 to convert the digital control signals into driving voltage signals for the individual transducer element channels in the pMUT array 616. Respective time delays can be added to the individual drive voltage signal by a programmable time-delay controller 610 to beam steer, create the desired beam shape, focus, and direction, etc. Noting each transducer element population includes a set of drive/sense electrodes, with each set having a least two drive/sense electrodes, such beam steering is to be applied to the drive voltage signals corresponding to each set of drive/sense electrodes to properly address an element population based on their spatial arrangement within the pMUT array. Coupled between the pMUT channel connector 602 and the signal generator is a switch network 612 to switch the pMUT array 616 between drive and sense modes. In further embodiments, the switch network 612 may also be utilized to switch between first and second drive/sense electrodes coupled to each of the transducer element populations (e.g., to switch between near and far field modes).

In embodiments, the apparatus 600 includes at least one signal receiver, which may be any known in the art for such purposes, coupled to the pMUT array 616, for example by way of electrical connector 620. The signal receiver(s) is to collect an electrical response signal from each the drive/sense electrode channels in the pMUT array 616. In the exemplary embodiment, these electrical signals include a first electrical response signal having a first frequency response spanning a bandwidth higher than that of the second electrical response signal. The signal receiver is to further apply one or more amplification factors to the electrical response signal received from each channel, which in a particular embodiment is different between channels of a same transducer element population (e.g., larger amplification applied to higher frequency channel). In one exemplary embodiment of a signal receiver, an analog to digital converter (ADC) 614 is to receive voltages signals and convert them to digital signals. The digital signals may then be stored to a memory (not depicted) or first passed to a signal processor. An exemplary signal processor includes a data compression unit 626 to compress the digital signals. A multiplexer 618 and a serializer 628 may further process the received signals before relaying them to a memory, other storage, or a downstream processor, such as an image processor that is to generate a graphical display based on the received signals.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A piezoelectric micromachined ultrasonic transducer (pMUT) array, comprising:
   a plurality of piezoelectric transducer element populations disposed over a substrate, each element population comprising a plurality of transducer elements which each include:
      a piezoelectric membrane; and
      a drive/sense electrode coupled to the piezoelectric membrane of the transducer element;
   wherein for each of the element populations, a size of a piezoelectric membrane of a first transducer element of the element population is different than a size of a piezoelectric membrane of a second transducer element of the element population;
   a plurality of sets of electrode rails disposed over the substrate, wherein for each of the plurality of sets of electrode rails, of the transducer element populations, the set of electrode rails is coupled to only a respective one of the transducer element populations, wherein a first electrode rail of the set of electrode rails is electrically coupled to the drive/sense electrode of the first transducer element of the respective one of the transducer element populations and a second electrode rail of the set of electrode rails is electrically coupled to the drive/sense electrode of the second transducer element of the respective one of the transducer element populations.

2. The pMUT array of claim 1, wherein a first element population includes:
   a first plurality of transducer elements each comprising a piezoelectric membrane of a first size; and
   a second plurality of transducer elements each comprising a piezoelectric membrane of a second size; and
   wherein the first electrode rail of a first set of electrode rails is electrically coupled to each of the drive/sense electrodes of the first plurality of transducer elements and the second electrode rail of the first set of electrode rails is electrically coupled to each of the drive/sense electrodes of the second plurality of transducer elements.

3. The pMUT array of claim 2, wherein transducer elements of the first element population are sequentially incremented in size along a distance over the substrate with the difference in size between any two adjacent membranes of the first element population being less that the difference in size between a largest membrane of the first element population and a smallest membrane of the first element population.

4. The pMUT array of claim 3, wherein each piezoelectric transducer element of the first element population has an ellipsoidal or spherical piezoelectric membrane.

5. The pMUT array of claim 4, wherein each element population includes n transducer elements having piezoelectric membranes of i differing sizes, and each of the plurality of sets of electrode rails comprises m electrode rails; and
   wherein the first element population includes j transducer elements of a same size, wherein the j transducer elements are electrically connected to a corresponding one of the m electrode rails coupled to the first element population, wherein n and i are each larger than 2.

6. The pMUT array of claim 5, wherein j is larger than 1 and m is equal to 2.

7. The pMUT array of claim 5, wherein a first subset of the n transducer elements of the first element population are to output to a first electrode rail y differing frequency responses that are of a lower frequency range than a frequency range of n−y differing frequency responses output to the second electrode rail by a second subset of the n transducer elements of the first element population.

8. The pMUT array of claim 1, wherein the plurality of sets of electrode rails form a linear array across a first dimension of the substrate, wherein each of the piezoelectric transducer element populations comprises a linear array across a second dimension of the substrate, and wherein the piezoelectric membranes of a first element population are circular or spheroidal with differing diameters.

9. The pMUT array of claim 1, wherein the plurality of sets of electrode rails forms a two-dimensional array of electrode rails along a first and second dimension of the substrate, and wherein the piezoelectric membranes of a first element population are circular or spheroidal with differing diameters.

10. An apparatus for generating and sensing pressure waves in a medium, the apparatus comprising:
    the pMUT array of claim 1;
    at least one signal generator coupled to the pMUT array to apply a first electrical drive signal on the first electrode rail of one of the plurality of sets of signal rails and a second electrical drive signal on the second electrode rail of the one of the plurality of sets of signal rails.

11. The apparatus of claim 10, wherein the first and second electrical drive signals have at least one of differing frequency, differing amplitude, or differing phase.

12. The apparatus of claim 10, wherein the first transducer element of one of the element populations is smaller than the second transducer element of the one of the element populations and wherein the first electrical drive signal has a larger voltage amplitude than that of the second electrical drive signal.

13. The apparatus of claim 10, further comprising:
    at least one receiver coupled to the pMUT array to receive a first electrical response signal from the first electrode rail of the one of the plurality of sets of signal rails and a second electrical response signal from the second electrode rail of the one of the plurality of sets of signal rails; and a signal processor coupled to the at least one receiver to process the received first and second electrical response signals.

14. The apparatus of claim 13, wherein the first electrical response signal has a first frequency response spanning a bandwidth higher than that of the second electrical response signal.

15. The apparatus of claim 13, wherein the first transducer element of the one of the element populations is smaller than the second transducer element of the one of the element populations and wherein the signal processor is to apply a larger amplification to the first electrical response signal than to the second electrical response signal.

16. The apparatus of claim 15, wherein the at least one signal generator is to modulate the first and second electrical drive signals and wherein signal processor is to modulate the first and second electrical response signals to generate a cumulative frequency response having a bandwidth greater than either the first or second electrical response signals.

17. A method of generating and sensing pressure waves in a medium with the pMUT array of claim 1, the method comprising:

generating a first electrical signal;

generating a second electrical signal;

applying the first electrical signal to the drive/sense electrode of the first transducer element of one of the element populations and the second electrical signal to the drive/sense electrode of the second transducer element of the one of the element populations; and modulating at least one of amplitude and phase of one of first and second signals relative to the other to control a penetration depth of the pMUT array.

18. The method of claim 17, wherein the piezoelectric membrane of the first transducer element of one of the element populations is smaller than the piezoelectric membrane of the second transducer element of the one of the element populations and wherein modulating at least one of amplitude and phase further comprises decreasing an amplitude of the first electrical drive signal relative an amplitude of the second electrical drive signal to increase the far field resolution of the pMUT array.

19. The method of claim 17, further comprising:

receiving a first electrical response signal from the drive/sense electrode of the first transducer element of the one of the element populations;

receiving a second electrical response signal from the drive/sense electrode of the second transducer element of the one of the element populations; and signal processing the first and second electrical response signals to generate a cumulative frequency response having a bandwidth greater than either of the first or second electrical response signals alone.

20. The method of claim 19, wherein the piezoelectric membrane of the first transducer element of the one of the element populations is smaller than the piezoelectric membrane of the second transducer element of the one of the element populations and wherein the signal processing further comprises increasing an amplification of the first electrical response signal relative an amplification of the second electrical response signal to increase the near field resolution of the pMUT array or increasing the amplification of the second electrical response signal relative that of the first electrical response signal to increase the far field resolution of the pMUT array.

* * * * *